US008686497B2

(12) United States Patent
Kwon et al.

(10) Patent No.: US 8,686,497 B2
(45) Date of Patent: Apr. 1, 2014

(54) DRAM CELL UTILIZING A DOUBLY GATED VERTICAL CHANNEL

(75) Inventors: WookHyun Kwon, Albany, CA (US); Tsu-Jae King Liu, Fremont, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/412,822

(22) Filed: Mar. 6, 2012

(65) Prior Publication Data

US 2012/0161229 A1 Jun. 28, 2012

Related U.S. Application Data

(63) Continuation of application No. PCT/US2010/048116, filed on Sep. 8, 2010.

(60) Provisional application No. 61/240,341, filed on Sep. 8, 2009.

(51) Int. Cl.
*H01L 29/78* (2006.01)
*H01L 21/336* (2006.01)

(52) U.S. Cl.
USPC .......................................... 257/331; 438/270

(58) Field of Classification Search
CPC ..... H01L 27/108; H01L 29/78; H01L 21/335; H01L 21/336; H01L 21/8242
See application file for complete search history.

(56) References Cited

U.S. PATENT DOCUMENTS 6,476,434 B1* 11/2002 Noble et al. .................. 257/302
8,349,662 B2* 1/2013 Liu .............................. 438/128
2002/0114191 A1* 8/2002 Iwata et al. .............. 365/185.23
2003/0139011 A1 7/2003 Cleeves et al.
2008/0227255 A1* 9/2008 Brown .......................... 438/270
2008/0272406 A1 11/2008 Banna
2011/0134691 A1* 6/2011 Bhattacharyya .............. 365/184

FOREIGN PATENT DOCUMENTS

WO 2008038953 A1 4/2008

OTHER PUBLICATIONS

Patti, A. et al.—“Artifact Reduction for Set Theoretic Super Resolution Image Reconstruction with Edge Adaptive Constraints and Higher-Order Interpolants”—IEEE Trans. on Image Processing, vol. 10, No. 1, Jan. 2001, pp. 179-186.
Wann et al.—“A Capacitorless DRAM Cell on SOI Substrate”—IEEE Int. Electron Devices Meeting, 1993, pp. 635-638.
Okhonin, S. et al.—“A SOI Capacitor-less 1T-DRAM concept”—Proc. IEEE Int. SOI Conf., Oct. 2001, pp. 153-154.
Kuo, C. et al—“A Capacitorless Double-Gate DRAM Cell Design for High Density Applications”—IEEE Int. Electron Devices Meeting, 2002, pp. 843-846.

(Continued)

*Primary Examiner* — Walter H Swanson
(74) *Attorney, Agent, or Firm* — John P. O’Banion

(57) ABSTRACT

A double-gate vertical channel transistor (DGVC) structure is described which is particularly well suited for Dynamic RAM (DRAM) memory (e.g., capacitorless DRAM) wherein the memory cell occupies a small cell area of $4F^2$, and provides beneficial retention properties including immunity to disturbances. The vertical transistors are arranged in an alternating gate-facing orientation, with a common source formed on a first end and separate drains on their second ends. Word lines comprise alternating front gates and back gates shared by columns of gate-facing transistors on each side of it. The DGVC cell provides enhanced scalability allowing the continued scaling of DRAM technology and can be fabricated using low-cost semiconductor materials and existing fabrication techniques. Fabrication techniques and array biasing are also described for the DGVC cell arrays.

9 Claims, 14 Drawing Sheets

(56) References Cited

OTHER PUBLICATIONS

Ban, I. et al.—"Floating Body Cell with Independently-Controlled Double Gates for High Density Memory"—Symposium on VLSI, 2007, pp. 1-4.
Schloesser, T. et al.—"A 6F2 Buried Wordline DRAM Cell for 40nm and Beyond"—IEEE Int. Electron Devices Meeting, 2008, pp. 1-4.
Butt, N. et al.—Scaling Limits of Double-Gate and Surround-Gate Z-RAM Cells, IEEE Trans. on Electron Devices, vol. 54, No. 9, Sep. 2007, pp. 2255-2262.
Korean Intellectual Property Office (KIPO), International Search Report and Written Opinion issued on Mar. 29, 2011, including claims searched, related PCT International patent application No. PCT/US2010/048116, pp. 1-12.

* cited by examiner

Silicon
$SiN_x$
Oxide
Contact
N+
Gate
Metal

DRAM CELL UTILIZING A DOUBLY GATED VERTICAL CHANNEL

CROSS-REFERENCE TO RELATED APPLICATIONS

This application a 35 U.S.C. §111(a) continuation of PCT international application number PCT/US2010/048116 filed on Sep. 8, 2010, incorporated herein by reference in its entirety, which is a nonprovisional of U.S. provisional patent application Ser. No. 61/240,341 filed on Sep. 8, 2009, which is incorporated herein by reference in its entirety. Priority is claimed to each of the foregoing applications.

The above-referenced PCT international application was published as PCT International Publication No. WO 2011/031749 on Mar. 17, 2011 and republished on May 19, 2011, and is incorporated herein by reference in its entirety.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to dynamic random access memory (DRAM) devices and, and more particularly to capacitorless DRAM memory cells.

2. Description of Related Art

The concept of a capacitorless DRAM cell was proposed to overcome scaling challenges for conventional 1-transistor/1-capacitor DRAM cells. The silicon-on-insulator (SOI) floating body cell (FBC) design was offered as a 4F2 cell (having a cell area of $4F^2$), but required more expensive SOI substrates, and was difficult to scale to very short channel lengths. The double-gate DRAM (DG-DRAM) cell was proposed as a more scalable design and was recently demonstrated at 70 nm gate length. However, the DG-RAM has a relatively large cell size ($8F^2$), is susceptible to disturbance when incorporated within a memory array, and is not easily integrated into a conventional memory process flow.

Accordingly, a need exists for a capacitorless DRAM cell design which can attain very small channel lengths within a small ($4F^2$) area and can be fabricated on low cost substrates using conventional techniques. These needs and others are met within the present invention, which overcomes the deficiencies of previously developed DRAM cell structures.

BRIEF SUMMARY OF THE INVENTION

A capacitorless DRAM cell and fabrication method is described which provides a small and highly scalable DRAM cell design without the need of Silicon-on-Insulator wafer (SOI) materials. It will be appreciated that the term "capacitorless" DRAM refers to the lack of separate charge storage capacitors, and not to the lack of capacitance with the active devices of the cell.

In order to overcome the deficiencies of previous capacitorless DRAM cell designs, this invention describes the use of a new double-gate vertical channel (DGVC) design for Dynamic RAM (DRAM) memory that can be fabricated on a bulk-Si wafer using a conventional process flow. The DGVC cell occupies a small cell area, and provides beneficial retention characteristics with immunity to disturbances from nearby cells. In comparison with existing DRAM cell designs, the DGVC cell is more scalable, so that it is an excellent structure for the continued scaling of DRAM technology. This invention also teaches configuring bias conditions for DGVC cell arrays and new fabrication methods.

Further aspects of the invention will be brought out in the following portions of the specification, wherein the detailed description is for the purpose of fully disclosing preferred embodiments of the invention without placing limitations thereon.

The invention is amenable to being embodied in a number of ways, including but not limited to the following descriptions.

One embodiment of the invention is a double-gate vertical channel (DGVC) memory cell array (e.g., without the need of separate charge storage capacitors), comprising: (a) a plurality of double-gate transistor cells having vertical channels within each DGVC cell of a DGVC memory cell array and arranged in an alternating gate-facing orientation; (b) a common source junction at a first end of the vertical channels which is shared by each the DGVC cell; (c) drain junctions formed at second ends of the vertical channels to which contact is made by bit lines, with one bit line for each row of DGVC cells within the DGVC memory cell array; (d) word lines comprising a plurality of gate lines, with the gate lines oriented orthogonally to the bit lines, for gating the vertical channels located on either side of each of the gate lines; (e) a front gate within each DGVC cell which is shared with a neighboring cell in a first direction along any given bit line; and (f) a back gate within each DGVC cell which is shared with a neighboring cell in a second direction along the any given bit line; wherein the DGVC cell array is configured for injecting holes into a DGVC cell during a write operation for retention to represent a first memory state, whereas a lack of holes represent a second memory state, as determined in a read operation on the DGVC cell.

At least one embodiment of the invention is configured without the need of charge storage capacitors separate from said plurality of double-gate transistor cells. In at least one embodiment the first end of the vertical channel at the bottom of the vertical channel, while the second end of the vertical channel is at the top of the vertical channel. In another embodiment the first end of the vertical channel is at the top of the vertical channel, while the second end of the vertical channel is at the bottom of the vertical channel. At least one embodiment of the invention can be implemented with a cell layout length of 2F on each side spanning an area of $4F^2$, in which F represents minimum feature size of a device technology in which the double-gate vertical channel (DGVC) cell array is fabricated. In at least one embodiment of the invention vertical channels comprise a semiconductor material (e.g., Silicon or other semiconductors), which is doped to form the source junctions (regions) and the drain junctions (regions). The bit lines and gate lines comprise electrically conductive materials.

At least one embodiment of the invention the DGVC memory cell further comprises a back channel interface of a body region of the DGVC memory cell which accumulates holes in response to impact ionization during a Write "1" operation and which are removed through the drain junction during a Write "0" operation; wherein hole storage in the body region lowers threshold voltage which increases drain current during said Read operation; wherein a "1" or "0" state of a DGVC memory cell is determined in response to how much drain current is sensed during a Read operation. The above describes a mechanism for accessing the memory cell. It should be appreciated that the DGVC cell can also be biased to form a potential well during a Hold operation to retain holes in the body region.

One embodiment of the invention is a memory circuit, comprising: a plurality of memory cells; (a) a double-gate vertical transistor structure within each memory cell; (b) a vertical channel within each double-gate vertical transistor structure having a source region and drain region disposed on opposite ends; (c) word lines comprising a plurality of gate lines; (d) said plurality of gate lines, having front gates and back gates, disposed on opposing sides of the vertical channels; wherein each memory cell, within the plurality of memory cells, shares the gate lines with neighboring memory cells; and (e) a plurality of bit lines coupled to the drain region of each double-gate vertical transistor structure; wherein the memory circuit is configured for injecting holes into a memory cell during a write operation for retention and representation of a first memory state, whereas a lack of holes represents a second memory state, as determined in a read operation on the memory cell.

One embodiment of the invention is a method of fabricating a dynamic memory cell array, comprising the steps of: (a) forming shallow trench isolation (STI) regions in a first direction through a nitride layer into a semiconductor to form stripes of semiconductor along a bit line direction; (b) etching trenches in a second direction, orthogonal to the first direction, to form self-aligned vertical channel structures along a word line direction; (c) performing an ion implantation to form a common source for the cells in the dynamic memory cell array; (d) insulating the vertical channel structures; (e) depositing a gate material over and along the sides of the insulated vertical channel structures; (f) etching back or planarizing the gate material to form separate front gate lines and back gate lines; (g) depositing a capping insulation layer or forming a capping insulation layer over the front gate lines and the back gate lines; (h) removing portions of the nitride covering one end of the vertical channel, while leaving spacers of nitride; (i) performing an ion implantation to form drain regions between the spacers; and (j) forming of bit lines in the first direction over the drain regions, in contact with the drain regions.

The present invention provides a number of beneficial elements which can be implemented either separately or in any desired combination without departing from the present teachings.

An element of the invention is a double-gate vertical channel (DGVC) cell array which can be utilized within dynamic memory arrays.

Another element of the invention is a DGVC array in which the vertical transistors are oriented in alternating gate-facing directions.

Another element of the invention is the use of a common source junction shared by the transistors in the array.

Another element of the invention is the use of front and back gates disposed on either side of the vertical channels.

Another element of the invention is the ability to use the DGVC cells in a "capacitorless" dynamic memory device.

Another element of the invention is that the required minimum cell layout size is 2F length on each side, wherein the cell covers an area of $4F^2$.

A still further element of the invention is the ability to fabricate the device in low cost material (e.g., Si, SiGe, and so forth) using conventional fabrication processes.

Further elements of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

DETAILED DESCRIPTION OF THE INVENTION

1. Introduction

In order to overcome the deficiencies of previous capacitorless DRAM cell designs, a new 4F2 double-gate vertical channel (DGVC) design is taught which can be fabricated on inexpensive materials (e.g., a bulk-Si wafer) using a conventional process flow. The operation and scalability of the DGVC cell are demonstrated using simulations, exemplified herein by the Synopsys® Sentaurus™ device simulation software. The present invention can employ preferred biasing arrangements which mitigate read and write disturbances in response to operation within a cell array.

2. Device Architecture and Proposed Fabrication Flow

Figure 1:
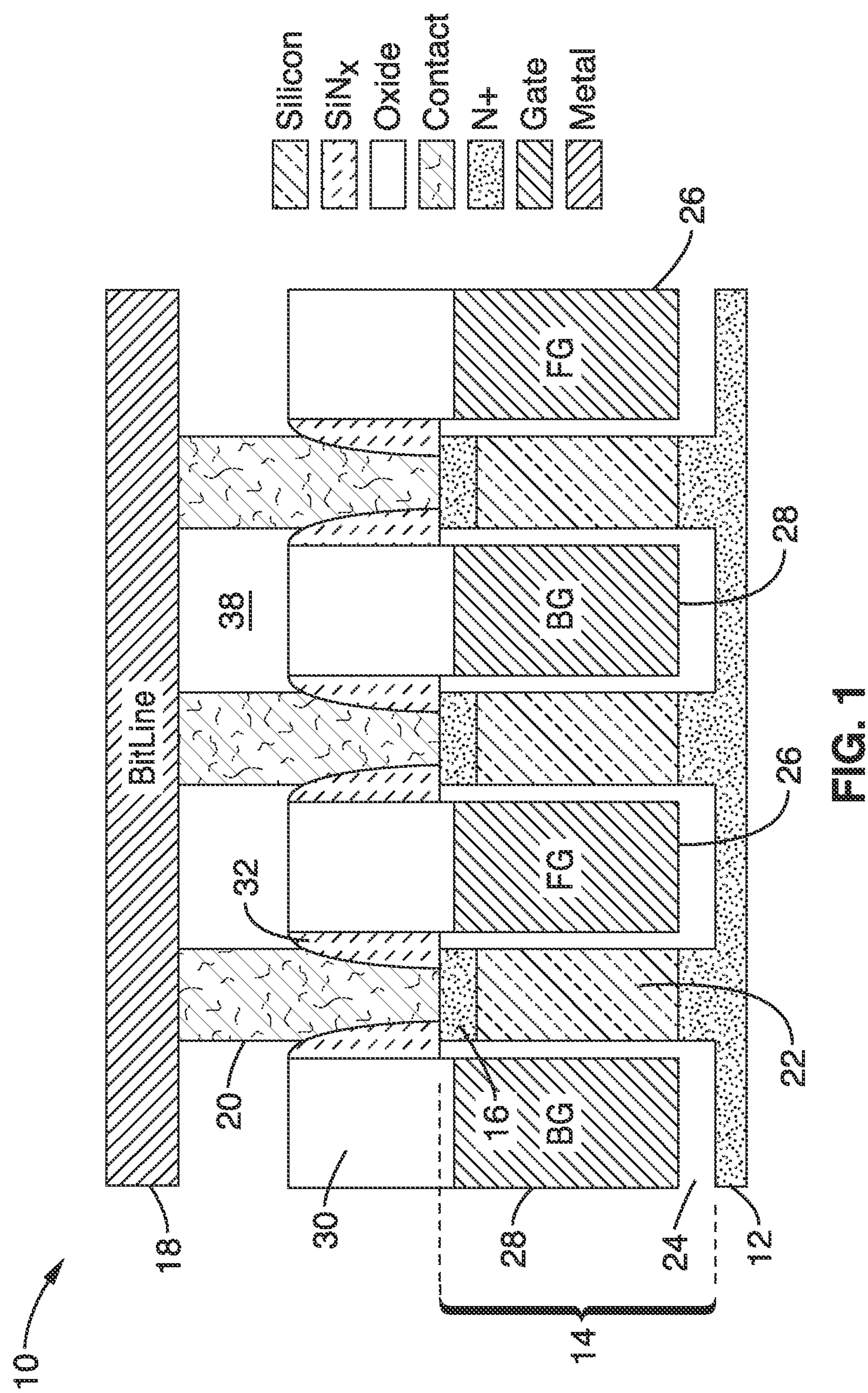
FIG. 1 is a cross-sectional view of DGVC cells fabricated according to an embodiment of the present invention, shown parallel to the bit line.
Figure 2:
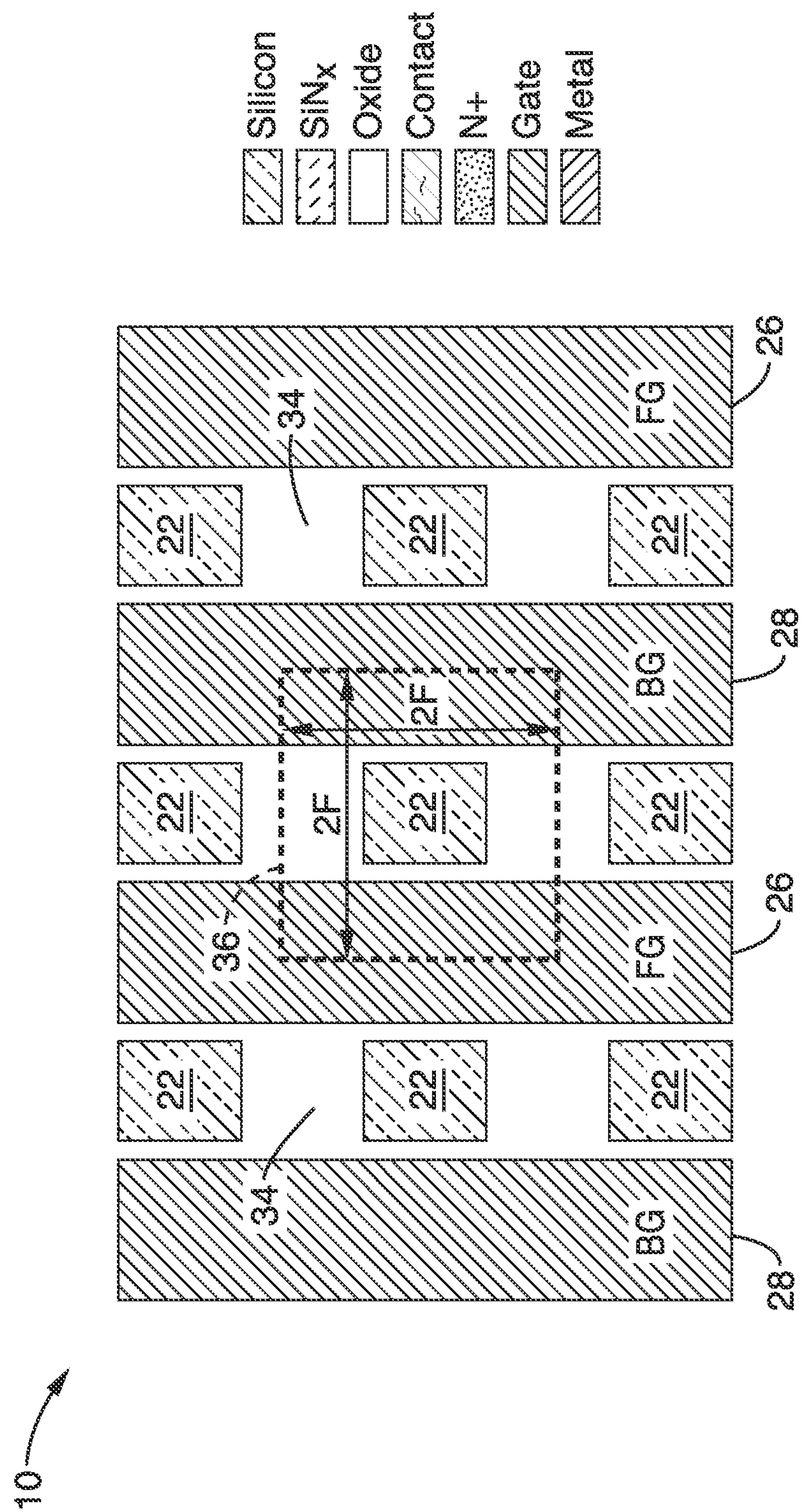
FIG. 2 is a top view cross section of a DGVC array according to an embodiment of the present invention.

FIG. 1 through FIG. 2 illustrate an example embodiment 10 of an array of Double-Gated Vertical-Channel (DGVC) cells. In FIG. 1 a cross section is shown taken along the bit-line direction. FIG. 2 depicts a plan view cross-section of an array of cells, and the boundary of a single cell 36 which is marked by the dashed lines. The cutting plane of FIG. 2 is through the vertical channel and word lines which appear in this top view cross section. The cell layout, which is of length 2F on each side, spans an area of $4F^2$ as can be seen in FIG. 2. It will be appreciated that "F" represents the minimum lithographically defined feature size for the given process technology being used to fabricate the DGVC array.

Considering FIG. 1 through FIG. 2, it will be seen that all of the cells within the array are preferably configured to share a common source junction 12, located at a first end (e.g., bottom, or top) of the combination of vertical channels and junctions 14. The drain junctions 16 are formed at an opposing second end (e.g., top, or bottom) of the vertical channels 22 and are contacted by bit lines 18, one for each row of cells within the array, through contacts 20. It should be appreciated that the device can be fabricated with the common source toward either the bottom or the top of the device depending on implementation.

A vertical channel 22 is shown between the vertical source and drain. Along the sides of the vertical channel are front gates (FG) 26, and back gates (BG) 28, separated by insulation 24 (e.g., oxide) from the vertical channel and its source and drain regions. The gate connection lines (word lines) are oriented (run) orthogonally to the bit lines (see FIG. 5), and each serves to gate the channels located on either side of it; thus each cell shares its front gate with a neighboring cell along the same bit line, and each cell shares its back gate with the opposite neighboring cell along the same bit line. Insulation 30 is shown disposed over the gate structures with a spacer 32, of a material such as $SiN_x$, extending over the drain region 16 for isolating the bit line connections from the gates. The DGVC embodiment described in FIGS. 1-2, can be manufactured with a Silicon (Si) vertical channel, doped N+ drain and common source regions, and metallic gates and bit lines. In this embodiment the connections 20 to the bit lines are fabricated of a conductive contact material (e.g., doped poly-Si, metal, or similar), while the space 38 between the connections contains insulating material (e.g., oxide). It should be appreciated that although Si is described herein for a preferred embodiment, silicon-germanium alloy (SiGe), and/or other semiconductor substrate materials may be utilized without departing from the teachings of the present invention.

The cutaway view of FIG. 2 is shown within a cutting plane through the vertical channel regions 22, so that one can see in the figure the relationship of the vertical channels separated by an insulator (e.g., oxide) from parallel alternating front and back gates (26, 28). Each section of vertical channel is separated along the gate direction from other vertical channels by an insulating spacer region 34.

FIG. 3A through FIG. 3H illustrate a fabrication process for the DGVC cell array. It should be appreciated that the sequence represents key steps of the process, and one of ordinary skill in the art will recognize that device fabrication involves numerous minor steps which can be performed in a variety of ways to support the key steps in a given fabrication process.

Figure 3A:
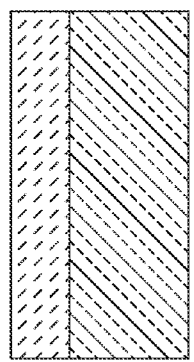
FIG. 3A through 3H is a process flow diagram for fabricating a DGVC array according to an embodiment of the present invention.
Figure 3B:
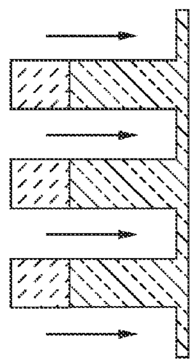
Figure 3C:
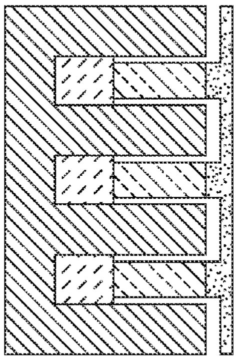
Figure 3D:
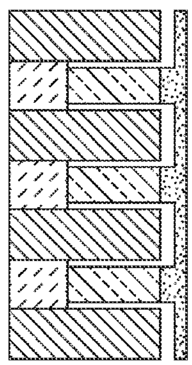
Figure 3E:
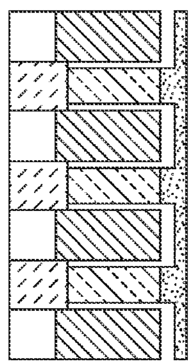
Figure 3F:
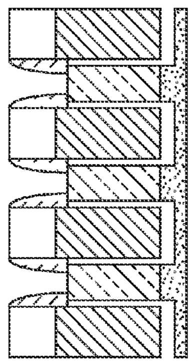
Figure 3G:
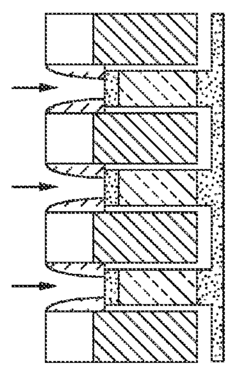
Figure 3H:
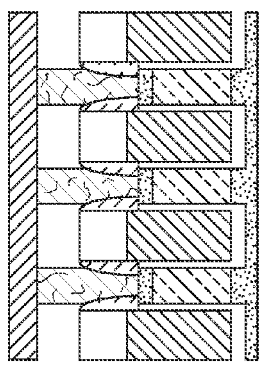

FIG. 3A illustrates that implantation of the common source region (doping the semiconductor) is performed, and a nitride layer is formed over the semiconductor. Shallow trench isolation (STI) is performed through the nitride layer and the underlying semiconductor to make stripes of semiconductor along the bit line direction (hidden in this view). It should be appreciated that the STI regions are shallower than the source region, as the trenches are, to allow the source to be shared across the entire array of memory cells. The stripes are then filled with an insulating material, such as an oxide. FIG. 3B illustrates trench etching to form self-aligned vertical channel structures along the word line (gate line) direction, cutting through both the stripes of oxide and semiconductor material. Afterward, insulation material is formed on the semiconductor, e.g., as in an oxidation process. FIG. 3C illustrates gate material deposition, such as depositing doped poly-Si, metal, or any sufficiently conductive material. FIG. 3D illustrates gate planarization. FIG. 3E illustrates forming an insulator layer in the upper portion of the gate material, such as by oxidation. FIG. 3F illustrates nitride removal leaving the spacers to confine the drain contact away from the gates. FIG. 3G illustrates drain implantation. FIG. 3H illustrates deposition of a covering insulation layer which is planarized prior to formation of contacts to the drains and the metal bit lines.

Figure 4A:
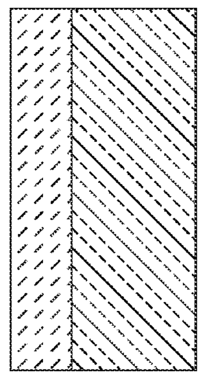
FIG. 4A through 4H is a process flow diagram for fabricating a DGVC array according to another embodiment of the present invention.
Figure 4B:
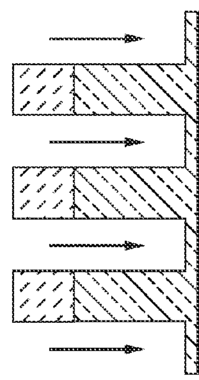
Figure 4C:
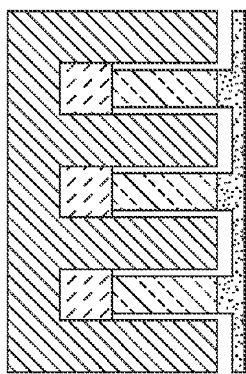
Figure 4D:
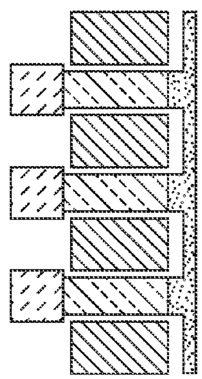
Figure 4E:
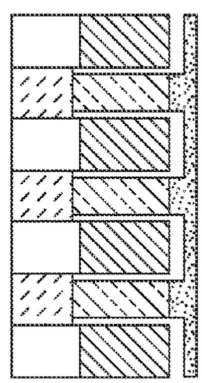
Figure 4F:
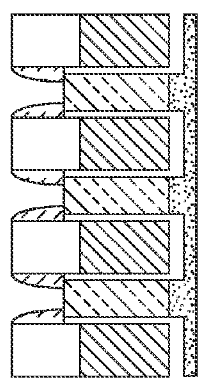
Figure 4G:
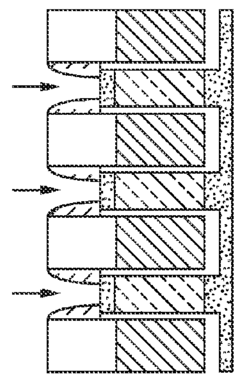
Figure 4H:
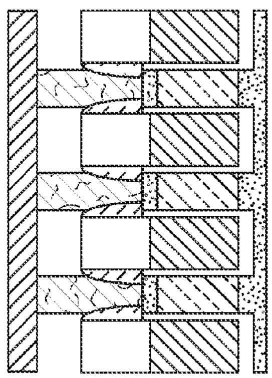

FIG. 4A through FIG. 4G illustrate a similar fabrication process as that described above. FIG. 4A illustrates that implantation of the common source region (doping the semiconductor) is performed, and a nitride layer is formed over the semiconductor. Shallow trench isolation (STI) performed through the nitride layer and the underlying semiconductor to make stripes of semiconductor along the bit line direction (hidden in this view). The stripes are then filled with an insulating material, such as an oxide. FIG. 4B illustrates trench etching to form self-aligned vertical channel structures along the word line (gate line) direction, cutting through both the stripes of oxide and semiconductor material. Afterward, insulation material is formed on the semiconductor, e.g., as in an oxidation process. FIG. 4C illustrates gate material deposition, such as depositing doped poly-Si, metal, or any sufficiently conductive material. FIG. 4D illustrates gate etchback. FIG. 4E illustrates capping oxide deposition over the gate material which is followed by planarization (e.g., CMP). FIG. 4F illustrates nitride removal leaving the spacers to confine the drain contact away from the gates. FIG. 4G illustrates drain implantation. FIG. 4H illustrates deposition of a covering insulation layer which is planarized before formation of contacts to the drains and the metal bit lines.

Figure 5:
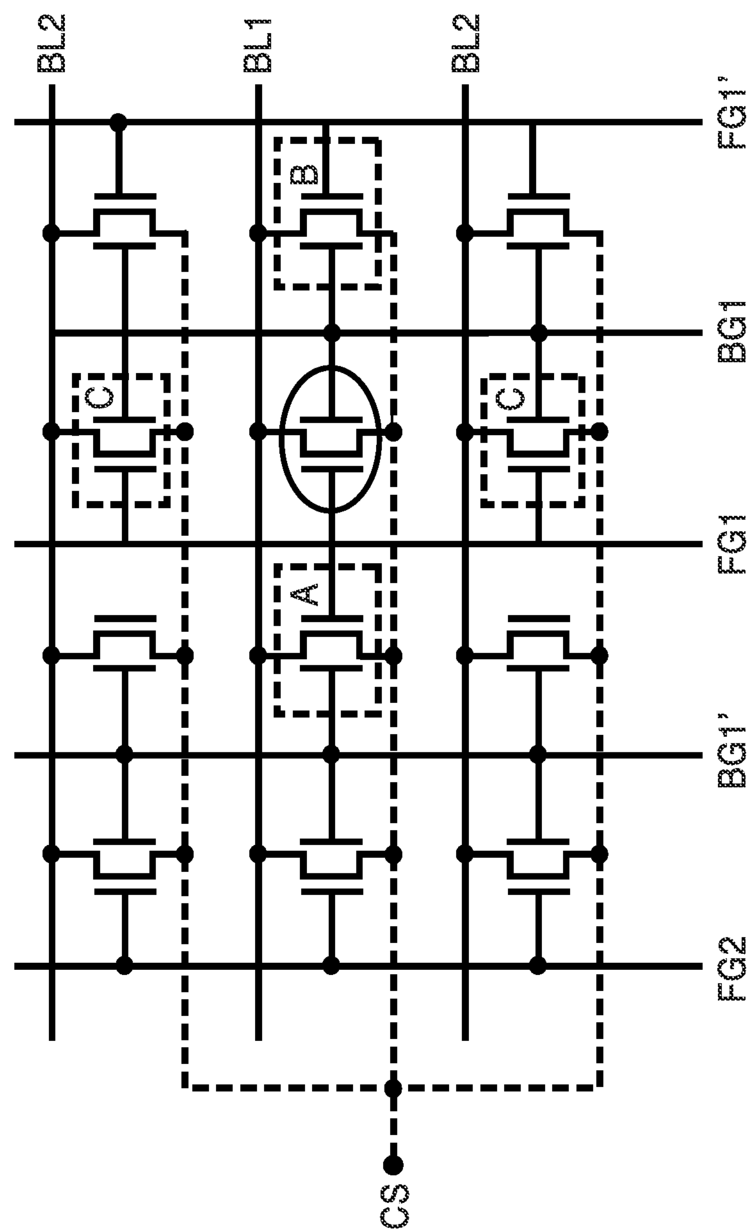
FIG. 5 is a schematic of a DGVC array according to an embodiment of the present invention, showing the front to back (gate-facing) transistor arrangement.

FIG. 5 illustrates an example embodiment of a DGVC cell array configuration to achieve optimized efficiency of the cell layout area ($4F^2$). A plurality of transistors are shown fabricated in alternating "gate-facing" directions, so that the front gates of one column of transistors is coupled to the front gates of an adjacent column of transistors, while similarly, the back gates of one column of transistors are coupled to the back gates of an adjacent column of transistors. Gates within these alternating direction transistors are coupled to alternating front gate and back gate signals respectively (e.g., FG2, BG1', FG1, BG1, FG1'). A common source junction (CS) is shown coupled to the sources of each of the transistors, with alternating bit lines (e.g., BL2, BL1, BL2) shown coupled to each row of transistors. It will be noted that one transistor is marked with a circle, about which are shown neighboring transistors in positions A, B and C.

3. Cell Operation

Three-dimensional device simulations were performed to investigate the operation of a DGVC cell with physical design parameters corresponding to 22 nm technology as listed in Table 1. Among other things, it is seen in this table that cell size for the example embodiment was 0.00194 $\mu m^2$, with the minority carrier lifetimes for the electrons and holes each being 1.5 μs.

The cell bias conditions are listed in Table 2, for Write, Hold, and Read operations. During a Write "1" operation, holes are generated by impact ionization and accumulate in the body region at the back channel interface. During a Write "0" operation, any holes in the body region are removed through the drain. During a Hold operation, the cell is biased to form a potential well to retain holes in the body region.

The state of the cell is determined by sensing the drain current during a Read operation: if holes are stored in the body, the threshold voltage will be lowered and hence the drain current will be higher.

Figure 6:
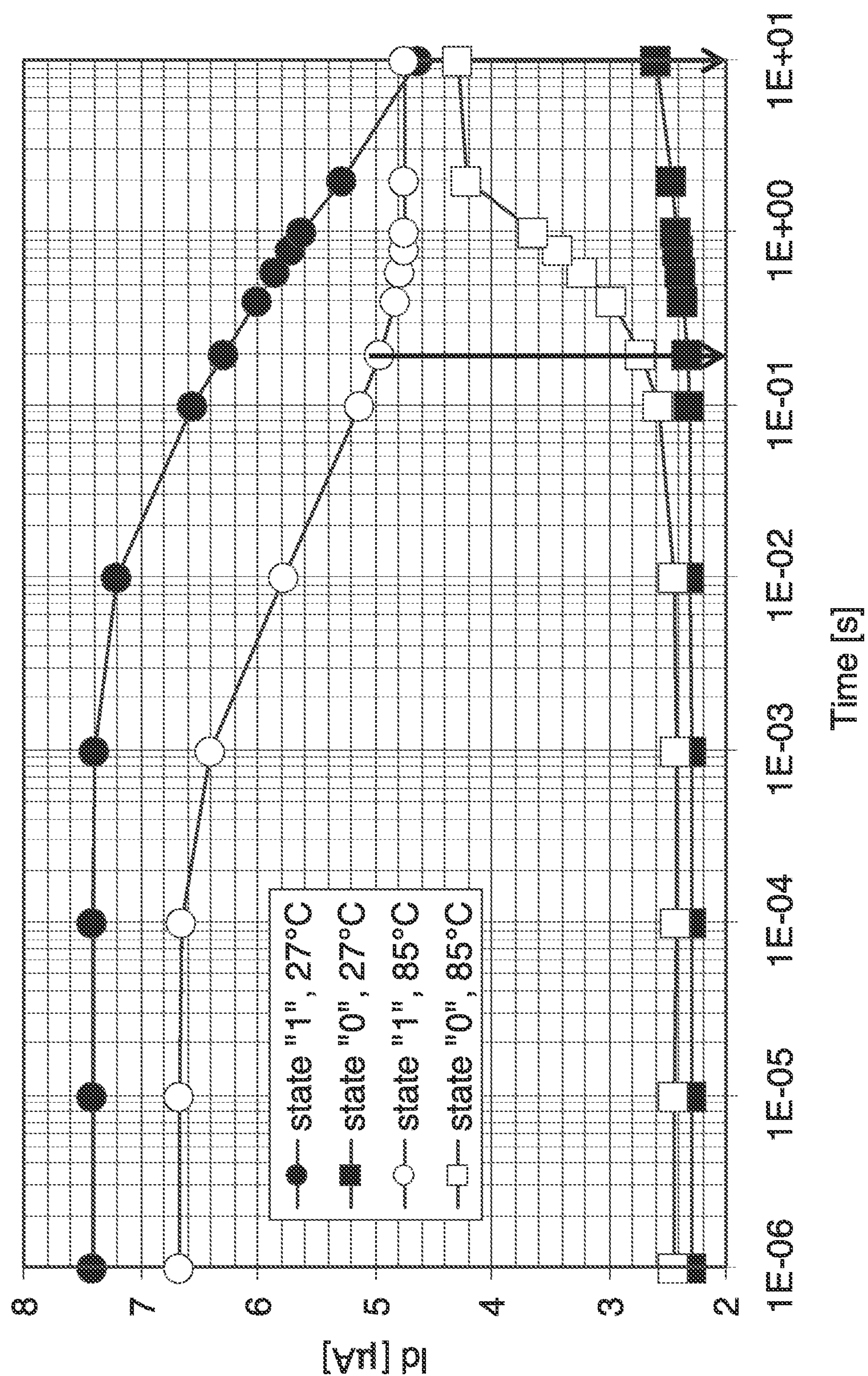
FIG. 6 is a graph of retention characteristics for a DGVC cell fabricated according to an embodiment of the present invention, showing a retention (storage) time of 200 ms.

FIG. 6 depicts retention characteristics for the DGVC cell according to the invention, shown in this example configured for read and write times of 20 ns. In this graph, the current levels for the "1" state and the "0" state can be clearly distinguished (by a margin of at least 2 μA) for a storage time as long as 200 ms at 85° C. These results indicate that the DGVC cell can meet retention requirements for stand-alone memory applications.

Figure 7:
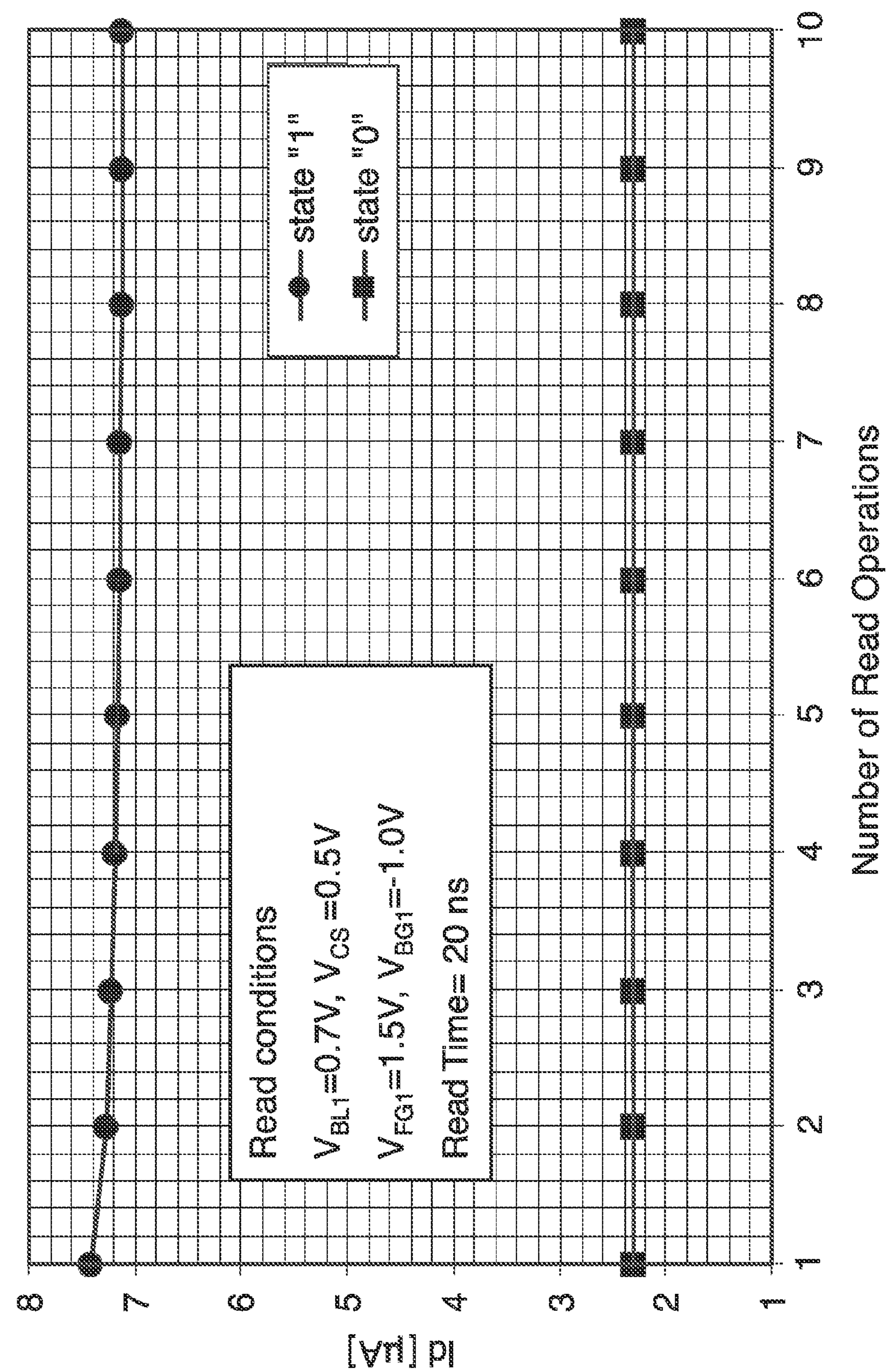
FIG. 7 is a graph showing the non-destructive readout characteristic of a DGVC cell fabricated according to an embodiment of the present invention.

FIG. 7 depicts non-destructive readout characteristics showing that a DGVC cell can be read non-destructively multiple times, whereby a refresh operation is not necessary after each read cycle.

In previous memory cell designs, a negative bit-line voltage was used to apply forward-bias on the body-drain diode to sweep out the accumulated holes during a Write "0" operation. This consequently disturbs unselected cells in the "1" state that are connected to the same bit line.

However, according to an aspect of the present invention a self-converging purge mechanism is utilized to avoid significant disturbance issues. This self-converging purge is achieved when the drain bias and back-gate bias are set to zero (Vd=0V and Vbg=0V) while applying a small positive source bias (Vs=0.5V), whereby the potential barrier for holes between the body and drain at the back channel interface is reduced so that excess holes in the body region flow out to the drain which causes the potential barrier to increase and hence the flow of holes to decrease, so that a steady-state condition (zero hole flow) is eventually reached. This biasing scheme allows a sufficient current margin (i.e., difference between readout currents for the "1" state and the "0" state) to be maintained for unselected cells that share the same back-gate line, indicated by "C" in FIG. 5.

Figure 8:
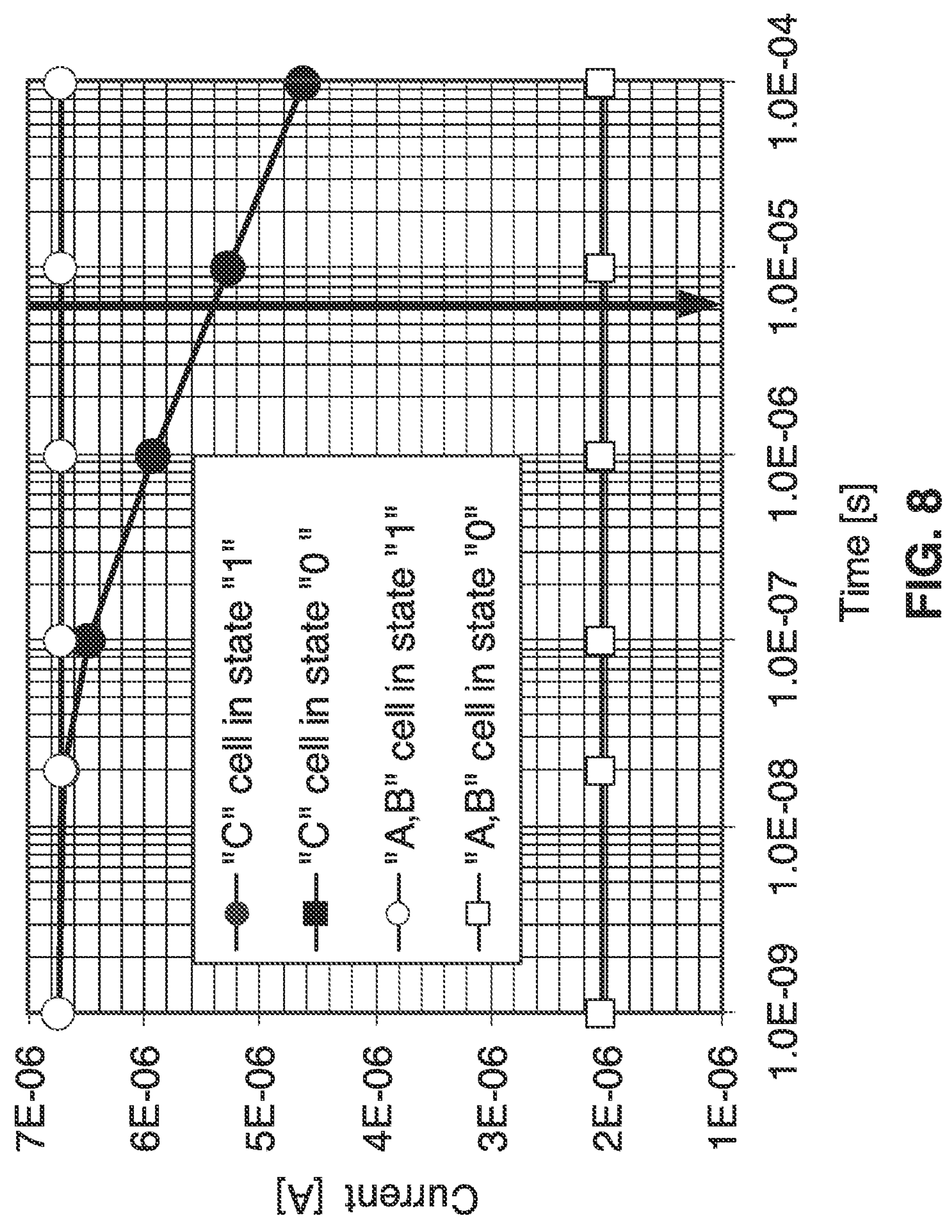
FIG. 8 is a graph of write "0" disturbance on the unselected cells according to an element of the present invention, assuming a 20 ns write time and 128(WL)×256(BL) array.

A Write "1" operation can potentially disturb unselected cells in the "0" state that are connected to the same bit line (refer to cells "A" and "B" in FIG. 5). FIG. 8 depicts that the biasing scheme maintains a sufficient current margin in the unselected cells for a write time as long as 5 μs. This is because disturbance of unselected cells along the same bit line, indicated by "A" and "B" in FIG. 5, can be avoided by applying negative gate biases (e.g., as indicated in Table 2) to maintain the hole potential barriers within these cells.

Figure 9:
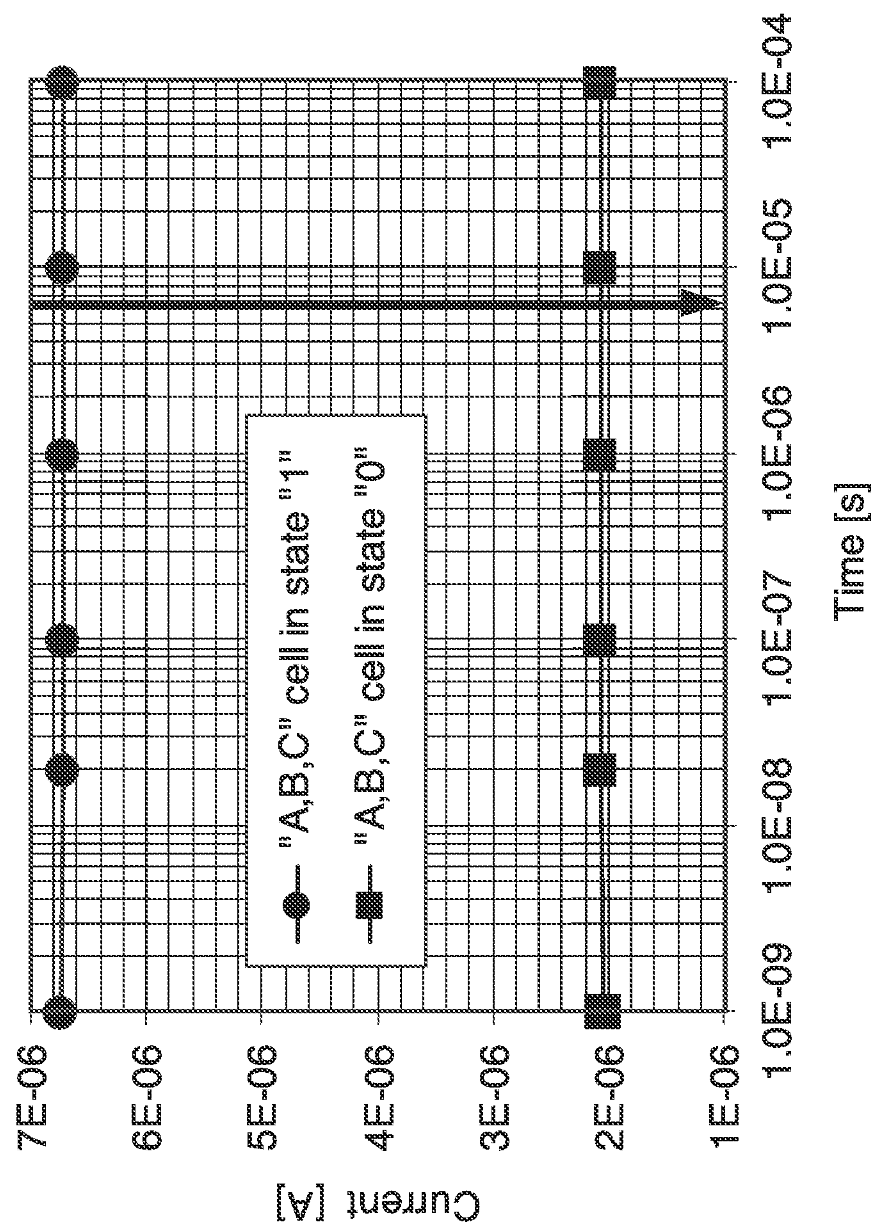
FIG. 9 is a graph of write "1" disturbance on the unselected cells according to an element of the present invention, assuming a 20 ns write time and 128(WL)×256(BL) array.

A Write "0" operation can potentially disturb unselected cells in the "1" state that are connected to the same bit line (refer to cells "A" and "B" in FIG. 5). FIG. 9 illustrates that unselected cell disturbance can be avoided by appropriately biasing the gate lines (refer to Table 2) to maintain the unselected cells in the off state.

4. Scalability

In order to investigate the scalability of the DGVC cell, read currents were simulated for cells with body thickness scaled proportionately with the technology node.

Figure 10:
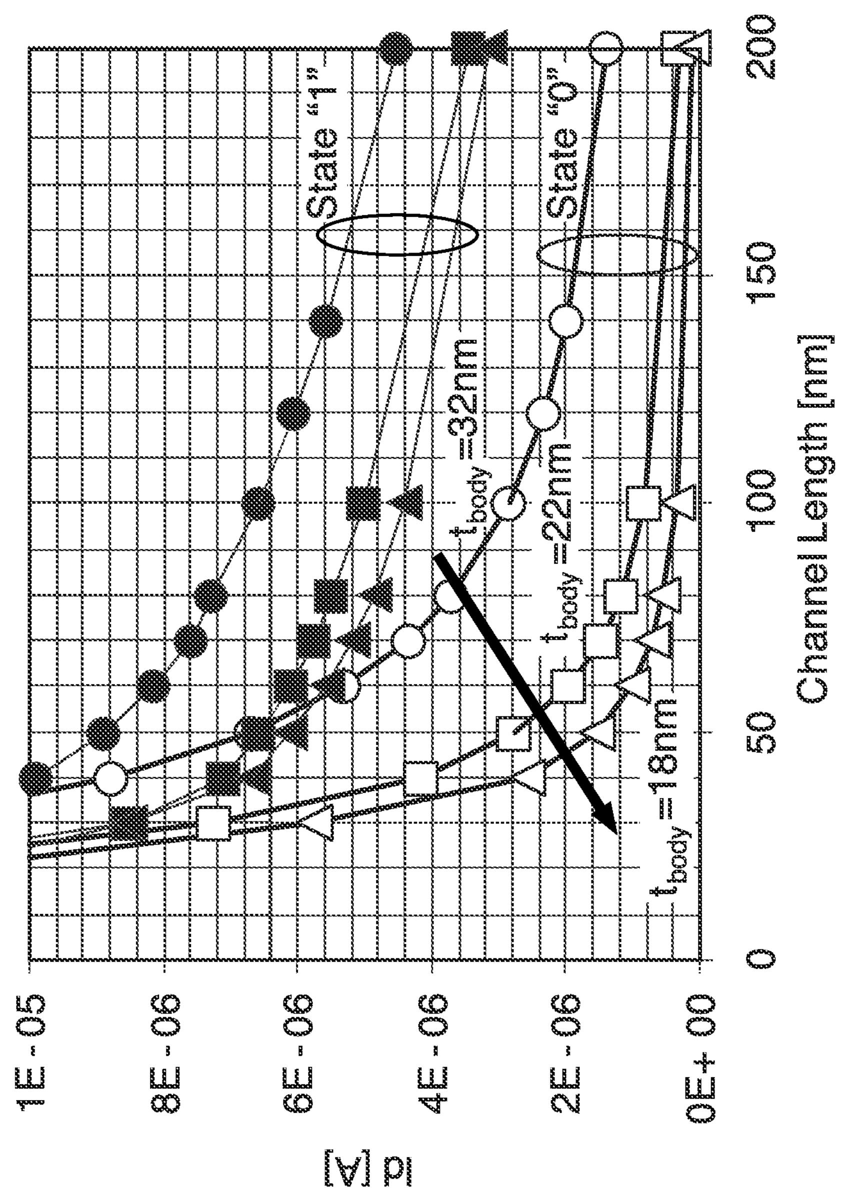
FIG. 10 is a graph of readout currents for "0" and "1" states according to an element of the present invention.
Figure 11:
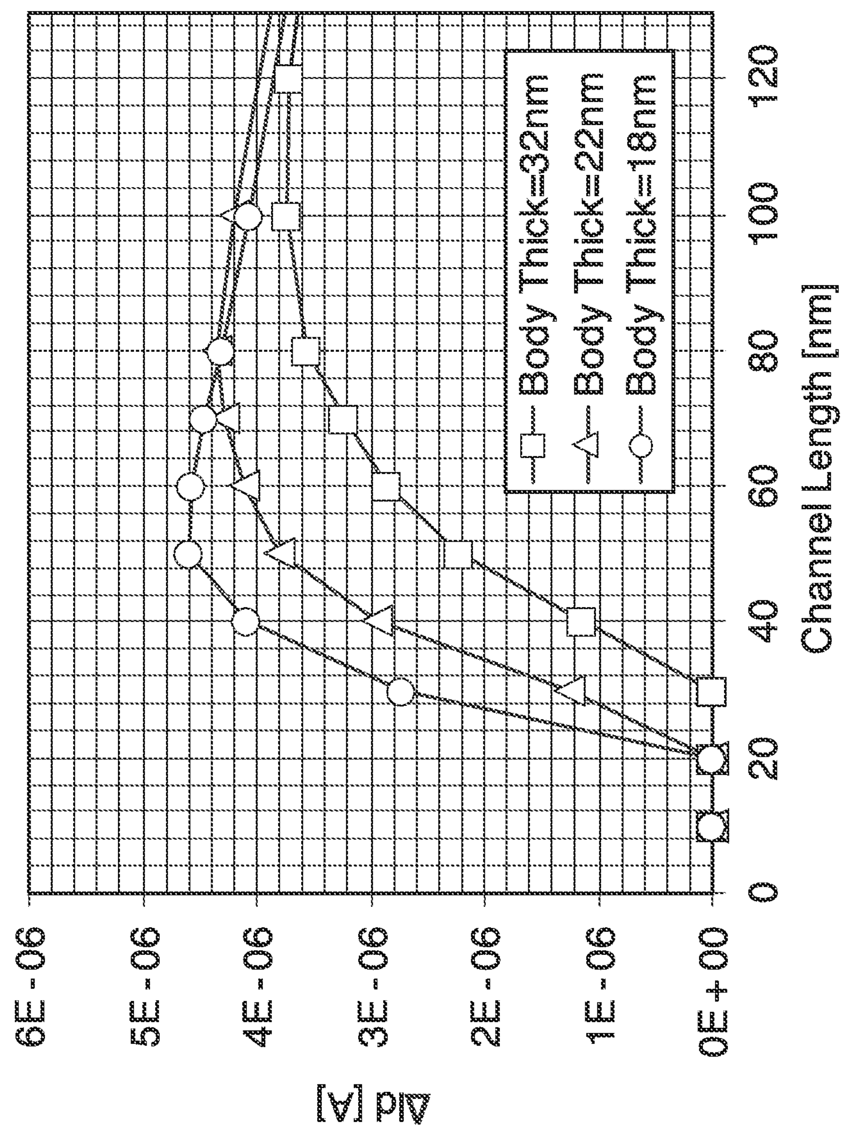
FIG. 11 is a graph of the readout current differences between "1" and "0" states according to an element of the present invention.

FIG. 10 through FIG. 11 illustrate current relationships with channel length. In FIG. 10 read currents are shown to depend on the channel length for each state. FIG. 11 shows that the optimal channel length for maximum current sensing margin scales with the body thickness, and that the optimal channel length is 80 nm for a 22 nm technology. At longer channel lengths, the "1" state current is lower, and at shorter channel lengths, the "0" state current is higher due to the effect of drain-induced barrier lowering (DIBL). A reduced body thickness reduces the DIBL effects and allows for a shorter channel length to increase the sensing margin.

Figure 12:
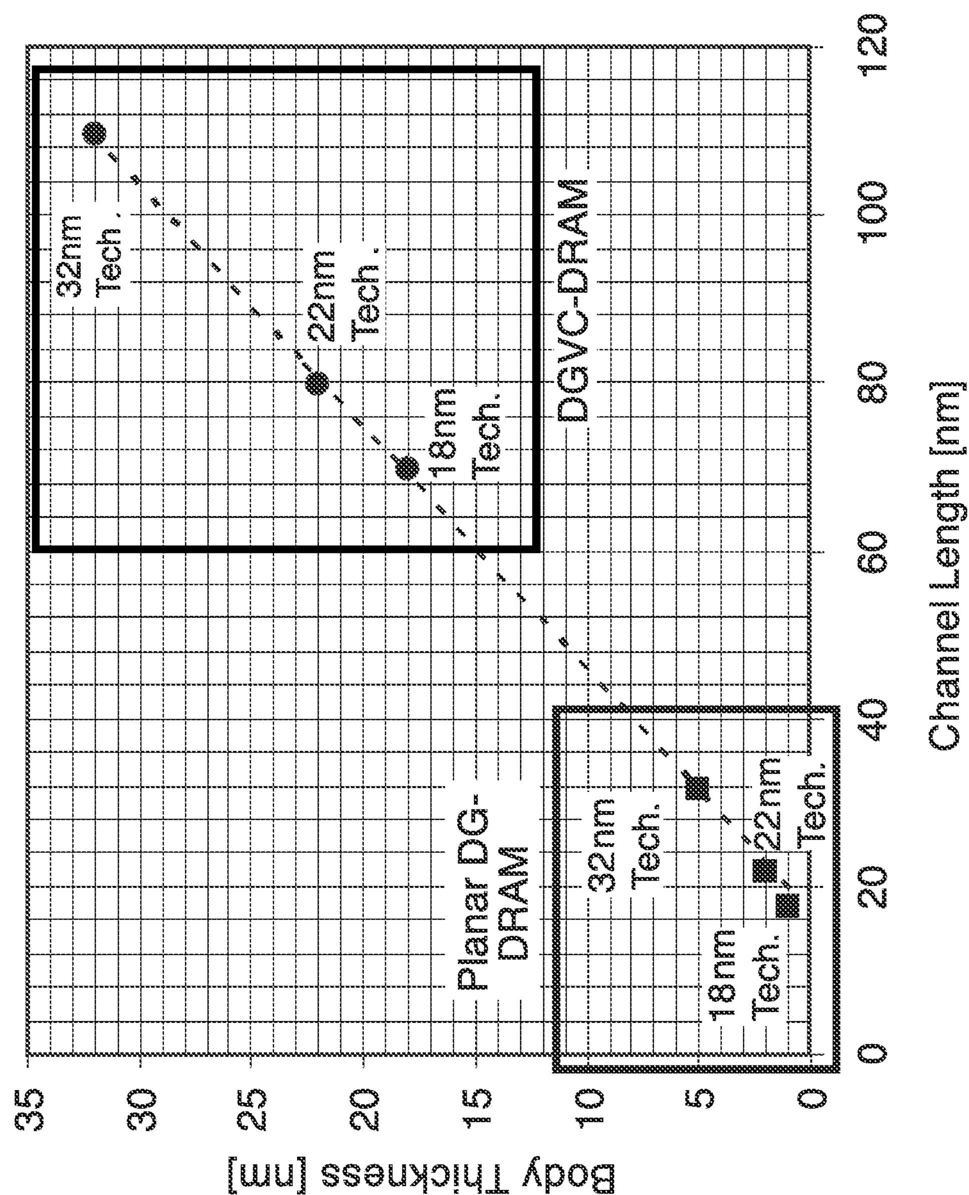
FIG. 12 is a graph of required body thickness for a given channel length comparing DGVC cells according to an embodiment of the present invention, with planar DG DRAM cells.

FIG. 12 compares the dimensions of the DGVC cell design against the planar DG-DRAM cell design, for the same technology nodes. It has been reported previously that channel length scaling of the planar DG-DRAM cell is limited to ~25 nm due to significant quantum confinement effects for body thicknesses below 4 nm. It should be appreciated that in view of the DGVC cell to provide longer channel lengths at a given technology node, the DGVC devices are a substantially more scalable design.

Figure 13:
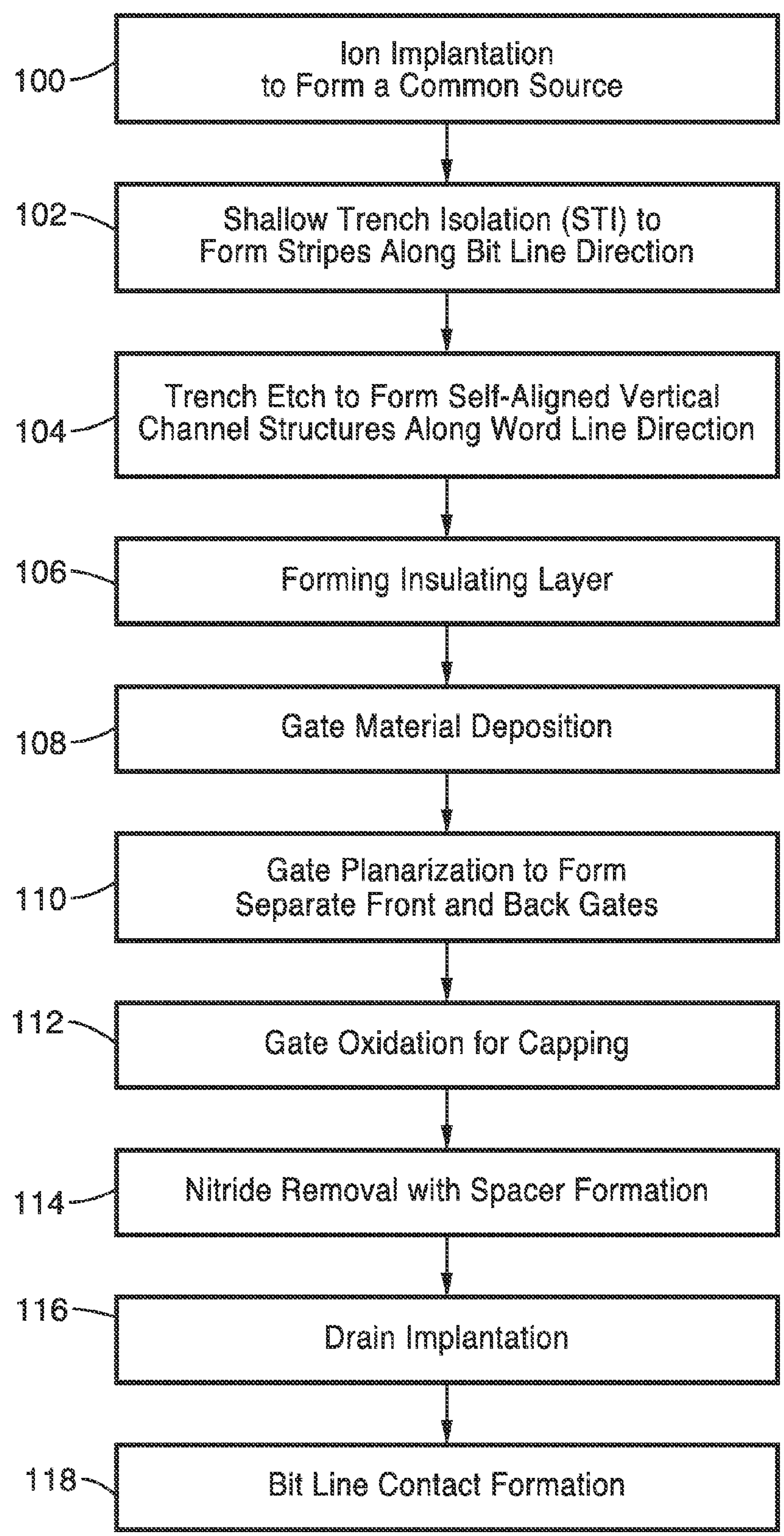
FIG. 13 is a flowchart of DGVC memory array fabrication according to an embodiment of the present invention.

FIG. 13 illustrates in summary, the fabrication of a DGVC memory cell array according to at least one embodiment of the present invention. The fabrication process includes performing a source implantation 100 to form a common source for the DGVC cells within the memory cell array, performing shallow trench isolation (STI) 102 to make stripes of semiconductor (e.g., Si) along the bit line direction, etching trenches 104 (across the STI) to form self-aligned vertical channel structures along the word line direction, forming an insulating layer 106 on the vertical channels, gate material deposition 108, gate planarization 110 at which time the gate material is separated into front and back gate lines, gate oxidation 112 for forming an insulating capping layer, nitride removal with spacer formation 114, drain implantation 116, and then bit-line contact formation 118.

Figure 14:
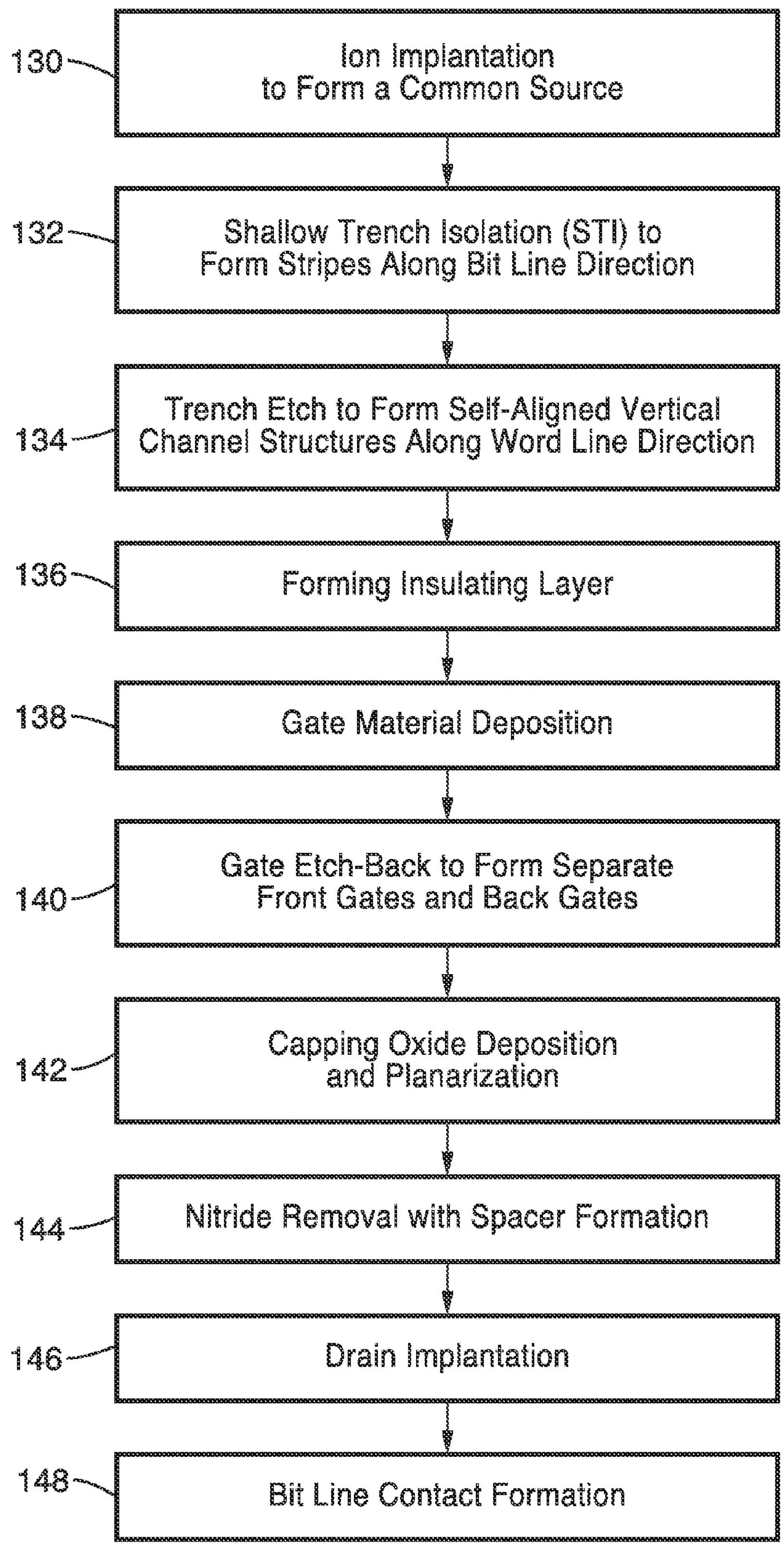
FIG. 14 is a flowchart of DGVC memory array fabrication according to another embodiment of the present invention.

FIG. 14 illustrates in summary fabrication of a DGVC memory cell array according to at least one embodiment of the present invention. The fabrication process includes performing a source implantation 130 to form a common source for the DGVC cells within the memory cell array, performing shallow trench isolation (STI) 132 to make stripes of semiconductor (e.g., Si) along the bit line direction and filling the trenches with insulation, etching trenches 134 (across the STI) to form self-aligned vertical channel structures along the word line direction, forming an insulating layer 136 on the vertical channels, gate material deposition 138, followed by gate etch-back 140 to form separate front and back gate lines, capping oxide deposition and planarization 142, nitride removal with spacer formation 144, drain implantation 146, and then bit-line contact formation 148.

5. Conclusion

A doubly gated vertical channel transistor structure is proposed as a highly scalable 4F2 DRAM cell design, one which can be fabricated using a conventional process flow sequence. Retention and disturbance immunity characteristics of a DGVC cell are shown to be adequate for stand-alone memory applications, at the 22 nm technology node (0.00194 $\mu m^2$ cell size. The vertical channel design allows for longer channel lengths as compared to a planar channel design, so that it is promising for 4F2 DRAM scaling to sub-22 nm technology nodes.

The present invention provides methods and apparatus for using double-gated vertical channel transistor structures within dynamic random access memories. Inventive teachings can be applied in a variety of apparatus, circuits and systems, including dynamic memory circuits, circuits and devices which incorporate one or more memory cells, and so forth.

From the discussion above it will be appreciated that the invention can be embodied in various ways, including the following:

1. A double-gate vertical channel (DGVC) memory cell array, comprising: a plurality of double-gate transistor cells each having a vertical channel and arranged in an alternating gate-facing orientation; a common source junction at a first end of the vertical channels which is shared by each said DGVC cell; drain junctions formed at second ends of the vertical channels to which contact is made by bit lines, with one bit line for each row of DGVC cells within the DGVC memory cell array; word lines comprising a plurality of gate lines; said gate lines oriented orthogonally to said bit lines, for gating said vertical channels located on either side of each of said gate lines; a front gate within each DGVC cell which is shared with a neighboring cell in a first direction along any given bit line; and a back gate within each DGVC cell which is shared with a neighboring cell in a second direction, opposite the first direction, along said any given bit line; wherein said DGVC cell array is configured for injecting holes into a DGVC cell during a write operation for retention to represent a first memory state, whereas a lack of holes in the DGVC cell represents a second memory state, as determined in a read operation on said DGVC cell.

2. The DGVC memory cell array of embodiment 1, wherein said DGVC cell is configured without the need of charge storage capacitors separate from said plurality of double-gate transistor cells.

3. The DGVC memory cell array of embodiment 1, wherein said first end of said vertical channel is at the bottom of said vertical channel, while said second end of said vertical channel is at the top of said vertical channel.

4. The DGVC memory cell array of embodiment 1, wherein said first end of said vertical channel is at the top of said vertical channel, while said second end of said vertical channel is at the bottom of said vertical channel.

5. The DGVC memory cell array of embodiment 1, wherein the cell layout has length 2F on each side, so that it covers an area of $4F^2$, (thus a 4F2 cell) in which F represents the minimum lithographically-defined feature size of a fabrication process technology in which said double-gate vertical channel (DGVC) cell array is fabricated.

6. The DGVC memory cell array of embodiment 1, wherein said vertical channels comprise a semiconductor material, which is doped to form said source junction and said drain junctions.

7. The DGVC memory cell array of embodiment 6, wherein said semiconductor material is silicon (Si), or silicon-germanium (SiGe).

8. The DGVC memory cell array of embodiment 1, wherein said bit lines and gate lines comprise electrically conductive materials.

9. The DGVC memory cell array of embodiment 1, wherein said DGVC cell array further comprises: a back channel interface of a body region of the DGVC memory cell which accumulates holes in response to impact ionization during a Write "1" operation and which are removed through the drain junction during a Write "0" operation; wherein hole storage in the body region lowers threshold voltage which increases drain current during said Read operation; wherein a "1" or "0" state of a DGVC memory cell is determined in response to how much drain current is sensed during a Read operation.

10. A memory circuit, comprising: a plurality of memory cells; a double-gate vertical transistor structure within each memory cell; a vertical channel within each double-gate vertical transistor structure having a source region and drain region disposed on opposite ends; word lines comprising a plurality of gate lines; gate lines, each comprising front gates and back gates, disposed on opposing sides of each said vertical channel along the word line direction; wherein each memory cell, within the plurality of memory cells, shares its front gate and back gate with neighboring memory cells; and bit lines coupled to said drain region of each double-gate vertical transistor structure along the bit line direction; wherein said memory circuit is configured for injecting holes into a memory cell during a write operation for retention and representation of a first memory state, whereas a lack of holes represents a second memory state, as determined in a read operation on said memory cell.

11. The memory circuit of embodiment 10, wherein said plurality of memory cells comprises a plurality of double-gate vertical transistor structures with channels positioned in gate facing orientations between the front and back gates.

12. The memory circuit of embodiment 10, wherein said source region is disposed at a common source region at a first end of the vertical channels which is shared by each said double-gate vertical transistor structure within said memory circuit; and wherein each said bit line is coupled to said drain region of each cell along the bit line direction at a second end of the vertical channels.

13. The memory circuit of embodiment 12, wherein said first end of said vertical channel is at the bottom of said vertical channel, while said second end of said vertical channel is at the top of said vertical channel.

14. The memory circuit of embodiment 12, wherein said first end of said vertical channel is at the top of said vertical channel, while said second end of said vertical channel is at the bottom of said vertical channel.

15. The memory circuit of embodiment 10, wherein said vertical channels comprise a semiconductor material, which is doped to form said source region and said drain region.

16. The memory circuit of embodiment 15, wherein said semiconductor material is silicon (Si) or silicon-germanium alloy material (SiGe).

17. The memory circuit of embodiment 10, wherein said bit lines and gate lines comprise electrically conductive materials.

18. The memory circuit of embodiment 10, wherein said DGVC cell is configured without the need of separate charge storage capacitors.

19. The memory circuit of embodiment 10, further comprising: a back channel interface of a body region of the double-gate vertical transistor structure which accumulates holes in response to impact ionization during a Write "1" operation and which are removed through the drain region during a Write "0" operation; wherein hole storage in the body region lowers threshold voltage which increases drain current during said Read operation; wherein a "1" or "0" state of each of said plurality of memory cells is determined in response to how much drain current is sensed during a Read operation.

20. A method of fabricating a dynamic memory cell array, comprising the steps of: performing an ion implantation to form a common source for the memory cells; performing shallow trench isolation (STI) in a first direction through a nitride layer into a semiconductor to form stripes of semiconductor along a bit line direction; etching trenches in a second direction, orthogonal to said first direction, to form self-aligned vertical channel structures along a word line direction; forming an insulating layer on said vertical channel structures; depositing a gate material over and along side insulated vertical channel structures; etching back or planarizing said gate material to form separate front gate lines and back gate lines; depositing capping insulation material or forming a capping insulation layer over said front gate lines and said back gate lines; removing portions of said nitride covering one end of the vertical channel, while leaving spacers of nitride; performing an ion implantation to form drain regions between said spacers; and forming contacts over the drains joining them to the bit lines.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

TABLE 1

| Simulated Cell Parameters<br>Parameters for example DGVC Device | |
|---|---|
| Technology node = 22 nm | Cell Size = 0.00194 $um^2$ (4F2) |
| $N_{body} = 10^{16}$ $cm^{-3}$ (p-type) | $N_{S/D} = 10^{20}$ $cm^{-3}$ (n-type) |
| $T_{ox}$ = 40 Å | $T_{body}$ = 200 Å |

TABLE 1-continued

| Simulated Cell Parameters<br>Parameters for example DGVC Device | |
|---|---|
| $L_{channel}$ = 50 nm<br>(Si pillar height) | $W_{active}$ = 22 nm<br>(Si pillar width) |
| $\tau_{electron}$ = 1.5 μs | $\tau_{hole}$ = 1.5 μs |

TABLE 2

Simulated Cell Bias Conditions

| | Write "1" | Write "0" | Hold | Read |
|---|---|---|---|---|
| FG1 | 1.5 V | 0.0 V | −1.0 V | 1.5 V |
| BG1 | −1.0 V | 0.0 V | −1.0 V | −1.0 V |
| BL1 | 2.0 V | 0.0 V | 0.5 V | 0.7 V |
| CS | 0.5 V | 0.5 V | 0.5 V | 0.5 V |
| BL2 | 0.5 V | 0.5 V | 0.5 V | 0.5 V |
| FG1' | −1.0 V | −2.0 V | −1.0 V | −2.0 V |
| BG1' | −2.5 V | −2.0 V | −1.0 V | −2.5 V |
| FG2 | −1.0 V | −1.0 V | −1.0 V | −1.0 V |
| Time | 20 ns | 20 ns | 100 ms | 20 ns |

What is claimed is:

1. A double-gate vertical channel (DGVC) memory cell array, comprising:

a plurality of double-gate transistor cells each having a vertical channel within each double-gate vertical channel (DGVC) cell of a DGVC memory cell array, with said double-gate transistor cells arranged in an alternating gate-facing orientation;

a common source junction at a first end of the vertical channels which is shared by each said DGVC cell;

drain junctions formed at second ends of the vertical channels to which contact is made by bit lines, with one bit line for each row of DGVC cells within the DGVC memory cell array;

gate lines oriented orthogonally to said bit lines, for gating said vertical channels located on either side of each of said gate lines;

a front gate within each DGVC cell which is shared with a neighboring cell in a first direction along any given one of the bit lines; and a back gate within each DGVC cell which is shared with a neighboring cell in a second direction, opposite the first direction, along any given one of the bit lines;

wherein said DGVC cell array is configured for injecting holes into a said DGVC cell during a write operation for retention to represent a first memory state, whereas a lack of holes in the DGVC cell represents a second memory state, as determined in a read operation on said DGVC cell.

2. The DGVC memory cell array as recited in claim 1, wherein said DGVC cell is configured without the need of charge storage capacitors separate from said plurality of double-gate transistor cells.

3. The DGVC memory cell array as recited in claim 1, wherein said first ends of said vertical channels are at bottoms of said vertical channels, while said second ends of said vertical channels are at tops of said vertical channels.

4. The DGVC memory cell array as recited in claim 1, wherein said first ends of said vertical channels are at tops of said vertical channels, while said second ends of said vertical channels are at bottoms of said vertical channels.

5. The DGVC memory cell array as recited in claim 1, wherein a layout of said DGVC cell has length 2F on each side, so that it covers an area of $4F^2$, in which F represents a minimum lithographically-defined feature size of a fabrication process technology in which said double-gate vertical channel (DGVC) cell array is fabricated.

6. The DGVC memory cell array as recited in claim 1, wherein said vertical channels comprise a semiconductor material, which is doped to form said source junction and said drain junctions.

7. The DGVC memory cell array as recited in claim 6, wherein said semiconductor material is silicon (Si), or silicon-germanium (SiGe).

8. The DGVC memory cell array as recited in claim 1, wherein said bit lines and gate lines comprise electrically conductive materials.

9. The DGVC memory cell array as recited in claim 1, wherein said DGVC memory cell array further comprises:

a back channel interface of a body region of the DGVC cell which accumulates holes in response to impact ionization during a Write "1" operation and wherein the holes are removed through a said drain junction during a write "0" operation;

wherein hole storage in the body region lowers threshold voltage which increases drain current during a read operation;

wherein a "1" or "0" state of the DGVC cell is determined in response to how much drain current is sensed during the read operation.

* * * * *